US010385575B2

(12) United States Patent
Grassa et al.

(10) Patent No.: US 10,385,575 B2
(45) Date of Patent: Aug. 20, 2019

(54) METHOD OF PLANNING SCAFFOLDING FOR CONSTRUCTION OF AN INDUSTRIAL PLANT

(71) Applicant: Peri GmbH, Weißenhorn Deutschland (DE)

(72) Inventors: Giovanni Grassa, Ontario (CA); Rod Skelton, Crossfield (CA); Dave Lawrence, Airdrie (CA)

(73) Assignee: PERI GMBH, Wissenhorn Deutschland (DE)

( * ) Notice: Subject to any disclaimer, the term of this patent is extended or adjusted under 35 U.S.C. 154(b) by 505 days.

(21) Appl. No.: 15/070,460

(22) Filed: Mar. 15, 2016

(65) Prior Publication Data

US 2016/0292310 A1    Oct. 6, 2016

(51) Int. Cl.
*E04G 1/00* (2006.01)
*G06F 17/50* (2006.01)
(Continued)

(52) U.S. Cl.
CPC ........... *E04G 1/00* (2013.01); *G06F 17/5004* (2013.01); *E04G 1/18* (2013.01); *E04G 1/36* (2013.01)

(58) Field of Classification Search
CPC .... E04G 1/00; E04G 1/18; E04G 1/36; G06F 17/5004; G06Q 50/08
See application file for complete search history.

(56) References Cited

U.S. PATENT DOCUMENTS

| | | | |
|---|---|---|---|
| 8,249,909 B2 * | 8/2012 | Watanabe | G06F 17/5004 705/7.15 |
| 2014/0257764 A1 * | 9/2014 | Seki | G06F 17/5004 703/1 |

FOREIGN PATENT DOCUMENTS

| | | |
|---|---|---|
| JP | HT108706 A | 1/1998 |
| JP | 2000 048061 A | 2/2000 |

(Continued)

OTHER PUBLICATIONS

Kim, K. & Teizer, J. "Automatic Design and Planning of Scaffolding Systems Using Building Information Modeling" Advanced Engineering Informatics, vol. 28, pp. 66-80 (2014) (Year: 2014).*

(Continued)

*Primary Examiner* — Jay Hann
(74) *Attorney, Agent, or Firm* — Mossman, Kumar & Tyler PC

(57) ABSTRACT

The invention is directed to a method for the construction of an industrial plant, in particular a petroleum refinery, by means of scaffolding units, each of which will be assembled from individual scaffolding components, comprising the following steps:
  Providing a 3D-construction plan in which building structures of the industrial plant are recorded;
  Drawing of scaffolding units to be used for the construction of the industrial plant in the 3D construction plan of the industrial plant including modifying of the 3D construction plan with respect to at least one building structure of the industrial plant for use of a predetermined scaffolding unit;
  Building of the industrial plant according to the modified construction plan and by use of the scaffolding units drawn in the 3D construction plan. The method according to the invention, allows for a significant reduction of scaffolding costs incurred during the construction of any industrial plant. The cost saving effects of the method according to the invention can be further increased by modifying the construction plan, wherever possible, for the use of the predetermined scaffolding units which may be of different or equal design.

13 Claims, 3 Drawing Sheets

(51) Int. Cl.
*E04G 1/18* (2006.01)
*E04G 1/36* (2006.01)

(56) References Cited

FOREIGN PATENT DOCUMENTS

JP           3524389 B2 *  5/2004
WO   WO 2007/113250 A1  10/2007

OTHER PUBLICATIONS

PCT/EP2017/054170—PCT Search Report dated Mar. 22, 2017.

* cited by examiner

METHOD OF PLANNING SCAFFOLDING FOR CONSTRUCTION OF AN INDUSTRIAL PLANT

CROSS REFERENCE TO RELATED APPLICATIONS

None.

BACKGROUND OF THE INVENTION

The invention refers to a method for construction of an industrial plant, in particular a petroleum refinery.

The surface area of industrial plants generally covers up to several square miles, which necessitates to group the entire construction project into numerous sections, where construction work is done simultaneously and/or sequentially. For the construction of large-scale industrial plants such as petroleum refineries or other types of plants for the chemical industry an enormous range of scaffolding parts for assembly of scaffolding units to be used is required.

For the construction work, detailed construction plans are essential, which are nowadays usually provided as three-dimensional (3D) plans. These construction plans, in particular, contain information on all building structures of the projected industrial plant, in particular on buildings, reactors, crackers, cokers, pipes for fluid transfer, electrical installations and so forth.

The total costs for the scaffolding and the scaffolding work provided on site significantly contribute to the total costs in industrial plant construction. Further, from experience, the actual costs incurred in conjunction with the scaffolding during construction of the industrial plant tend to exceed the projected costs by far.

SUMMARY OF THE INVENTION

It is, therefore, the object of the invention to provide an improved method for construction of an industrial plant by which scaffolding costs can be further reduced.

The method according to the invention for the construction of an industrial plant, in particular a petroleum refinery, by means of scaffolding units, each of which will be assembled from individual scaffolding components, comprises the following steps:
a) Providing a 3D-construction plan in which building structures of the industrial plant are recorded, that is shown;
b) Drawing of scaffolding units to be used for the construction of the industrial plant in the 3D construction plan of the industrial plant, wherein the 3D construction plan is modified with respect to at least one building structure of the industrial plant for use of a predetermined scaffolding unit; and
c) Building of the industrial plant according to the modified construction plan and by use of the scaffolding units drawn in the 3D construction plan.

The drawing of the scaffolding units to be used for the actual construction of the industrial plant together with modifying the construction plan for the use of at least one predetermined scaffolding unit allows for use of a scaffolding unit of a simpler construction as would be necessary otherwise. Thereby, the overall time required for erection and/or dismantling of the predetermined scaffolding unit can be reduced. This offers cost advantages. These effects may actually be multiplied by modifying the construction plan with regard to several building structures for use of a plurality of predetermined scaffolding units. It is understood that the aforementioned scaffolding units may be of the same or of different design. In the latter case, the said scaffolding units may consist of the same or of a different number of scaffolding parts or components, in particular those of identical design.

According to a preferred embodiment of the invention, the 3D construction plan is modified with respect to the spatial arrangement, size and/or construction of the building structure.

With regard to the spatial arrangement of the building structure, the said building structure may e.g. be moved laterally when compared to its original location as depicted in the construction plan. Also, a level adjustment of the building structure may be feasible. Further, the spatial orientation of the building structure with regards to other building structures may be modified to thereby accommodate the predetermined scaffolding unit in the construction plan and on the construction site during the construction work.

By these measures, the predetermined scaffolding unit having e.g. a fixed height, width or length may be integrated and drawn in the construction plan and be used for construction during the actual construction of the industrial plant.

According to a preferred embodiment of the invention, the 3D construction plan is modified with respect to a building structure which is designed as a fluid line or as an electrical line. Fluid lines are an essential component of industrial, in particular chemical, plants and are commonly used for transport of petroleum, water, gases and the like from the site of one production process to another or e.g. to a storage tank. Such industrial fluid lines may have a diameter up to 20 feet and may run several floors above the ground. Repositioning of such a fluid line a few inches or feet may allow use of a much simpler and more cost-efficient predetermined scaffolding unit than without these measures.

According to a further embodiment of the invention, a welding seam of the aforementioned fluid line is repositioned such that it can be generated by use of the predetermined scaffolding unit. In particular for the construction of petroleum refineries or other chemical plants there is such a large number of welding seams for fluid lines is necessary that this measure alone can significantly reduce the overall scaffolding costs for the industrial plant.

According to a further embodiment of the invention, modifying the construction plan is done with respect to a load-bearing building structure of the industrial plant. The load-bearing structure may, in particular, be a foundation, a supporting column of steel and/or concrete or a longitudinal/cross beam.

According to a further embodiment of the invention, the at least one building structure is provided with support points for the predetermined scaffolding unit. Providing the building structure with support points may be accompanied by a modification of the structural dimensioning of the building structure to increase its load-bearing capacity required for support of the predetermined scaffolding unit.

According to the invention, the predetermined scaffolding unit is advantageously designed as a sliding scaffolding unit which may be rail guided. In particular, the aforementioned support points may serve to support the said rails for the rail-guided scaffolding unit.

According to a yet further embodiment of the invention, the provision of the 3D-construction plan and drawing of the scaffolding units in the 3D construction plan including modifying the 3D construction plan is done by means of a computer-installed software. The 3D construction plan is thus provided in an electronic and computer-readable format which may be viewed by means of the software.

According to a preferred embodiment of the invention, the method comprises providing a predefined range of different scaffolding units in the software and selecting at least part of the scaffolding units to be used for the construction of the industrial plant therefrom. By this, the drawing of the individual scaffolding units in the 3D construction plan is facilitated and can be performed much faster.

According to an embodiment of the invention, the scaffolding units to be used for construction of the industrial plant, in particular the ones which are predefined in the software, can all be assembled from scaffolding parts which are compatible with each other and which belong to a manufacturer-specific scaffolding type or system.

BRIEF DESCRIPTION OF THE DRAWINGS

For a fuller understanding of the nature and objects of the invention, reference should be made to the following detailed description taken in connection with the accompanying drawings wherein.

DETAILED DESCRIPTION OF THE INVENTION

Figure 1:
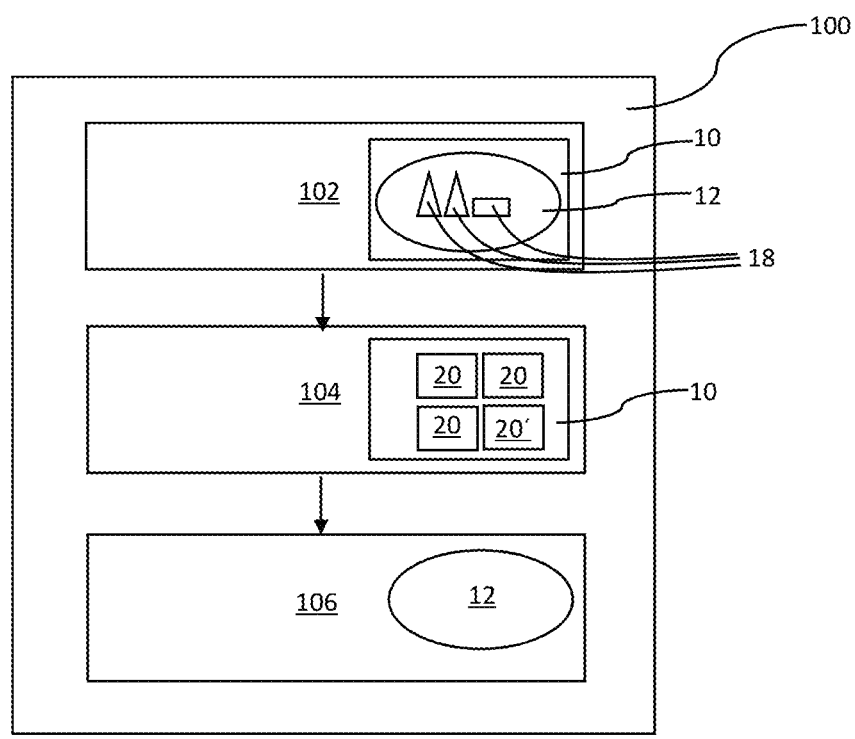
FIG. 1 is a diagrammatic view of the method according to the invention for the construction of an industrial plant, in particular a petroleum refinery.
Figure 2:
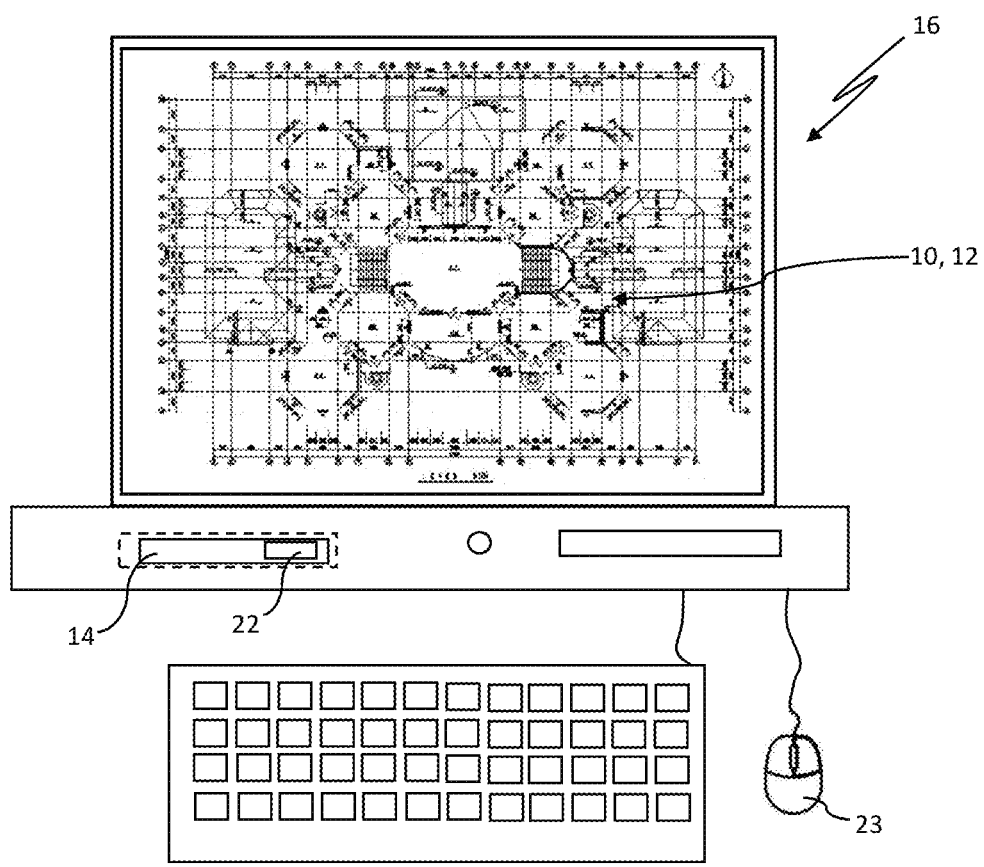
FIG. 2 shows a computer used for the method according to FIG. 1.

Reference is now made to FIG. 1 which shows a diagrammatic view of a method for the construction of an industrial plant, in particular a petroleum refinery, by means of scaffolding units, each of which will be assembled from individual scaffolding components according to the invention. A scaffolding unit is basically a temporary and/or movable platform or structure on which a person stands or sits while working high above the floor or ground. The scaffolding unit is in each case assembled from a variety of scaffolding elements which are compatible with each other such that the safety requirements are met. The method according to the invention, which is generally designated by reference numeral 100 in FIG. 1 comprises the following steps:

A first step 102 comprises providing a 3D-construction plan 10 of the industrial plant 12. In step 102, the 3D construction plan 10 is preferably provided in a computer-readable electronic format. Thereby, the 3D construction plan 10 may be conveniently visualized for a user as a whole and in detail by means of a suitable computer (graphics) software 14 which is installed on a computer 16 as shown in FIG. 2. It is needless to say that computer 16 features a suitable storage media for storage of said computer software 14. In the construction plan 10 building structures 18 of the projected industrial plant 12 such as buildings and their constituent parts, concrete/steel columns, fluid lines, in particular pipes, electrical lines and all relevant further installations are shown in detail and in a three dimensional format.

A following step 104 of the method 100 according to the invention comprises drawing of scaffolding units 20, 20' to be used for the construction of the industrial plant 12 in the 3D construction plan 10 with modifying the 3D construction plan 10 with respect to at least one of the building structures 18 of the industrial plant 12 for use of a predetermined scaffolding unit 20, 20'. The drawing of the scaffolding units 20, 20' in the 3D construction plan 10 can, in particular, be done by means of the computer-installed software 14 (FIG. 2). Thereby, a user may, for instance, easily zoom into the construction plan 10 for a detailed 3D-view of the various building structures 18 of the projected industrial plant 12. Further, building structures 18 colliding with the use of the predetermined scaffolding unit 20, 20' can thereby be easily and quickly recognized. Also, the computer software 14, according to the present invention, preferably comprises a data base 22 with a range of scaffolding units of different (base) construction. These scaffolding units are each to be assembled from scaffolding components compatible with each other and which, for safety reasons, are preferably all part of a manufacturer-specific scaffolding system. At least part of the scaffolding units 20, 20' to be used for the construction of the industrial plant 12 may then be easily selected by a user from the database provided by the software and drawn in the 3D construction plan 10 of the industrial plant 12. For this, the software 14 advantageously supports a so-called drag & drop operation. The computer software 14 is further preferably programmed to allow altering scaffolding units 20, 20' drawn in the 3D construction plan at least as to their dimensioning while automatically adjusting the number of their scaffolding components 24 required for assembly thereof and which may each be visualized in the construction plan. Altering the scaffolding units 20, 20' in the 3D construction plan 10, according to the present invention, may then, for instance, be achieved by clicking and dragging the scaffolding units 20, 20' with a peripheral computer device 23, in particular a computer mouse, as shown in FIG. 2.

Figure 3:
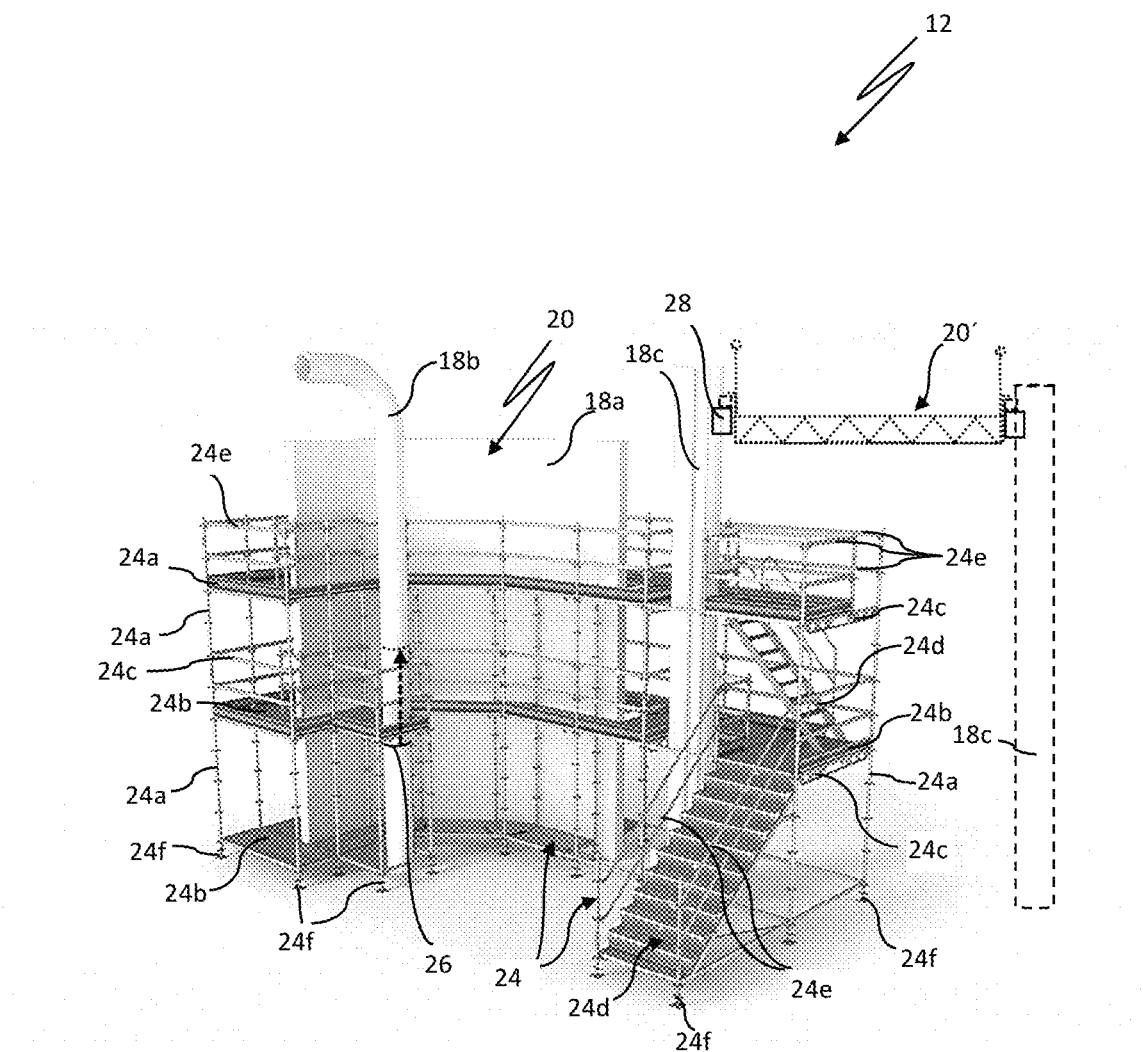
FIG. 3 shows an exemplary view of a scaffolding unit to be used for construction of the industrial plant.

In FIG. 3, two exemplary designs of said predetermined scaffolding units 20, 20' to be used for construction of the industrial plant 12 are shown. The predetermined scaffolding unit 20—as any other scaffolding unit 20 to be used for construction of the industrial plant 12 may comprise scaffolding components 24 such as e.g. vertical posts 24a, working platforms 24b, cross members 24c, staircases 24d, hand rails 24e, adjustable feet 24f and so forth. The scaffolding unit 20 shown allows workers to perform construction work on building structures 18 of the industrial plant 12. The building structures 18 may, for instance, be formed as a (e.g. concrete) wall 18a, a fluid line 18b or a load-bearing concrete or steel column 18c which may, for instance, serve as a support of a roof or a flooring of the industrial plant.

The 3D construction plan 10 of the industrial plant 12 can, for instance, be modified with respect to a spatial arrangement of the building structure 18. For instance, the fluid line 18b, the column 18c or the wall as shown in FIG. 3 may be repositioned sideways such that the predetermined scaffolding unit 20 can be drawn in the 3D construction plan 10 and be used for building of the industrial plant 12. Alternatively, the size of the respective building structure 18 may be altered for use of the predetermined scaffolding unit 20, 20'. Further, the respective building structure 18 may be altered with respect to its construction. For instance, a welding seam 26 of the fluid line 18b shown in FIG. 3, which, according to the 3D construction plan of the industrial plant, is originally recorded in the 3D construction plan, could not be possibly generated by workers supported by any of the working platforms of the scaffolding unit shown. Therefore, the welding seam 26, according to the invention, may be relocated to a position e.g. higher up such that it can be easily and safely generated by workers with use of the predetermined scaffolding unit 20 as exemplarily shown in FIG. 3.

Further, the building structure 18, in particular when structured as a column 18c as shown in FIG. 3, may be provided with support points 28 for the predetermined scaffolding unit 20'. The predetermined scaffolding unit 20' may, for instance, be formed as a rail-guided scaffolding unit 20' as is schematically shown in dashed lines in FIG. 3.

It needs to be understood, that the cost-saving effect of the method 100 according to the invention may be potentiated if the 3D construction plan 10 is modified with respect to several building structures 18 of the industrial plant 12 for use of a plurality of predetermined scaffolding units 20, 20.

According to the invention, method 100 further comprises building step 106 of the industrial plant according to the modified construction plan 10 and by use of the scaffolding units 20, 20' drawn in the 3D construction plan 10.

The method 100 according to the invention as described above is, overall, based on the underlying concept of making small modifications to one or more building structures 18 of the projected industrial plant 12 to thereby enable the use of (a) predetermined scaffolding unit(s) 20, 20' which may be of a specified simple construction and/or which may be assembled/disassembled in a more time-efficient manner and/or which offer wider usage options as is the case, for instance, in a rail-guided sliding scaffolding unit when compared to the scaffolding units that would be necessary for the construction work without such modifications.

What is claimed is:

1. A method for the construction of an industrial plant, in particular a petroleum refinery, comprising the following steps:
   selecting scaffolding units, each of which will be assembled from individual scaffolding components, the scaffolding components having at least one fixed dimension selected from: a height, a width, and a length;
   providing a 3D construction plan in which building structures of the industrial plant are recorded in a computer-readable electronic format in a computer, the 3D construction plan being visualizable using software installed on the computer;
   drawing the scaffolding units to be used for the construction of the industrial plant in the 3D construction plan of the industrial plant, the drawing being done using the software installed on the computer;
   modifying the 3D construction plan with respect to at least one building structure of the industrial plant by revising the least one building structure to support the scaffolding units, the modifying being done using the software installed on the computer; and
   building the industrial plant according to the modified construction plan and by using the scaffolding units drawn in the 3D construction plan.

2. A method for the construction of an industrial plant, in particular a petroleum refinery, comprising the following steps:
   selecting scaffolding units, each of which will be assembled from individual scaffolding components, the scaffolding components having at least one fixed dimension selected from: a height, a width, and a length;
   providing a 3D construction plan in which building structures of the industrial plant are recorded in a computer-readable electronic format in a computer, the 3D construction plan being visualizable using software installed on the computer;
   drawing the scaffolding units to be used for the construction of the industrial plant in the 3D construction plan of the industrial plant, the drawing being done using the software installed on the computer;
   modifying the 3D construction plan with respect to at least one building structure of the industrial plant by repositioning the least one building structure in order to use the scaffolding units to construct the building structure, the modifying being done using the software installed on the computer; and
   building the industrial plant according to the modified construction plan and by using the scaffolding units drawn in the 3D construction plan.

3. Method according to claim 2, further comprising using the computer to modify the 3D construction plan with respect to a spatial arrangement, size and/or construction of the building structure.

4. Method according to claim 2, further comprising using the computer to modify the 3D construction plan with respect to the at least one building structure which is designed as a fluid line or as an electrical line.

5. Method according to claim 4, further comprising using the computer to reposition a welding seam of the fluid line such that it can be generated by use of the predetermined scaffolding unit.

6. Method according to claim 2, further comprising using the computer to modify the construction plan with respect to a load-bearing building structure of the industrial plant.

7. Method according to claim 6, further comprising providing the at least one building structure with support points for the predetermined scaffolding unit.

8. Method according to claim 2, wherein the predetermined scaffolding unit is a, preferably rail guided, sliding scaffolding unit.

9. Method according to claim 2, further comprising using the computer to modify the 3D construction plan with respect to several building structures of the industrial plant for use of a plurality of predetermined scaffolding units.

10. Method according to claim 2, wherein at least part of the scaffolding units to be used for the construction of the industrial plant in the 3D construction plan of the industrial plant are selected from a range of different scaffolding units predefined in the software.

11. Method according to claim 10, wherein the scaffolding units which are predefined in the software can all be assembled from scaffolding parts which are compatible with each other and which belong to a manufacturer-specific scaffolding program or system.

12. Method according to claim 2, wherein the at least one building structure is selected from at least one of: (i) a electrical line, (ii) a fluid line, and (iii), a load bearing structure.

13. Method according to claim 2, wherein the at least one building structure is repositioned to avoid colliding with the scaffolding units.

* * * * *